United States Patent
Leuschner et al.

(10) Patent No.: US 9,837,199 B2
(45) Date of Patent: Dec. 5, 2017

(54) TRANSFORMER AND ELECTRICAL CIRCUIT

(71) Applicant: Intel Mobile Communications GmbH, Neubiberg (DE)

(72) Inventors: Stephan Leuschner, Munich (DE); José Moreira, Munich (DE); Peter Pfann, Munich (DE)

(73) Assignee: INTEL DEUTSCHLAND GMBH, Neubiberg (DE)

( * ) Notice: Subject to any disclaimer, the term of this patent is extended or adjusted under 35 U.S.C. 154(b) by 0 days.

(21) Appl. No.: 14/183,618

(22) Filed: Feb. 19, 2014

(65) Prior Publication Data

US 2014/0240063 A1    Aug. 28, 2014

(30) Foreign Application Priority Data

Feb. 22, 2013    (DE) .................. 10 2013 101 768

(51) Int. Cl.
*H01F 27/28*    (2006.01)
*H03F 1/56*    (2006.01)
(Continued)

(52) U.S. Cl.
CPC ......... *H01F 27/2804* (2013.01); *H01F 27/28* (2013.01); *H03F 1/223* (2013.01); *H03F 1/565* (2013.01); *H03F 3/193* (2013.01); *H03F 3/195* (2013.01); *H03F 3/21* (2013.01); *H03F 3/245* (2013.01); *H03F 3/45188* (2013.01); *H03F 3/45659* (2013.01); *H01F 2027/2809* (2013.01); *H03F 2200/09* (2013.01); *H03F 2200/387* (2013.01); *H03F 2200/411* (2013.01); *H03F 2200/541* (2013.01); *H03F 2203/45631* (2013.01)

(58) Field of Classification Search
CPC .............. H01P 5/04; H01P 5/10; H01P 5/185
USPC ....................................... 333/24 R
See application file for complete search history.

(56) References Cited

U.S. PATENT DOCUMENTS

| | | | |
|---|---|---|---|
| 4,802,080 A | 1/1989 | Bossi et al. | |
| 5,497,137 A | 3/1996 | Fujiki | |

(Continued)

FOREIGN PATENT DOCUMENTS

| | | |
|---|---|---|
| CN | 101242159 A | 8/2008 |
| DE | 68924792 T2 | 5/1996 |

(Continued)

OTHER PUBLICATIONS

Kehrer et al. "Modeling of Monolithic Lumped Planar Transformers up to 20 GHz" IEEE, Custom Integrated Circuits Conference, 2001, pp. 401-404.

(Continued)

*Primary Examiner* — John Poos
(74) *Attorney, Agent, or Firm* — Viering, Jentschura & Partner mbB

(57) ABSTRACT

A transformer is provided. The transformer includes at least one first primary turn; at least one second primary turn; and a first secondary turn and a second secondary turn. The first secondary turn and the second secondary turn are arranged laterally between the at least one first primary turn and the at least one second primary turn. The first secondary turn and the second secondary turn are arranged one above the other.

15 Claims, 10 Drawing Sheets

(51) Int. Cl.
*H03F 3/193* (2006.01)
*H03F 3/21* (2006.01)
*H03F 1/22* (2006.01)
*H03F 3/195* (2006.01)
*H03F 3/24* (2006.01)
*H03F 3/45* (2006.01)

(56) References Cited

U.S. PATENT DOCUMENTS

| | | | |
|---|---|---|---|
| 5,969,590 | A | 10/1999 | Gutierrez |
| 6,396,362 | B1 | 5/2002 | Mourant et al. |
| 6,683,510 | B1* | 1/2004 | Padilla .................. 333/25 |
| 6,927,664 | B2 | 8/2005 | Nakatani et al. |
| 7,317,354 | B2 | 1/2008 | Lee |
| 7,456,721 | B2 | 11/2008 | Chiu |
| 7,486,168 | B2 | 2/2009 | Kim |
| 7,675,365 | B2 | 3/2010 | Lee et al. |
| 7,812,701 | B2 | 10/2010 | Lee et al. |
| 7,936,215 | B2 | 5/2011 | Lee et al. |
| 7,990,220 | B2 | 8/2011 | Kondo et al. |
| 8,044,759 | B2 | 10/2011 | Yang et al. |
| 8,665,052 | B2 | 3/2014 | Lai |
| 2001/0033204 | A1* | 10/2001 | Simburger et al. ......... 333/24 R |
| 2003/0231095 | A1* | 12/2003 | Liang ................. H01F 17/0013 336/223 |
| 2006/0091958 | A1 | 5/2006 | Bhatti et al. |
| 2006/0284719 | A1 | 12/2006 | Lee |
| 2008/0157913 | A1 | 7/2008 | Kim |
| 2008/0164941 | A1 | 7/2008 | Lee et al. |
| 2008/0272875 | A1 | 11/2008 | Huang et al. |
| 2008/0284552 | A1* | 11/2008 | Lim ................... H01F 17/0006 336/200 |
| 2009/0174515 | A1 | 7/2009 | Lee et al. |
| 2009/0284339 | A1 | 11/2009 | Choi et al. |
| 2010/0117737 | A1 | 5/2010 | Kondo et al. |
| 2010/0140738 | A1 | 6/2010 | Liu et al. |
| 2010/0301987 | A1 | 12/2010 | Belot et al. |
| 2011/0037555 | A1 | 2/2011 | Lai |
| 2011/0210792 | A1 | 9/2011 | Kawakami et al. |
| 2012/0274434 | A1 | 11/2012 | Lim et al. |
| 2014/0225698 | A1 | 8/2014 | Swirhun et al. |

FOREIGN PATENT DOCUMENTS

| | | |
|---|---|---|
| DE | 19944741 A1 | 4/2001 |
| DE | 102008003396 A1 | 7/2008 |
| DE | 102011088715 A1 | 10/2012 |
| EP | 0220914 A1 | 5/1987 |
| EP | 0324240 A2 | 7/1989 |
| JP | H0614447 Y2 | 4/1994 |
| JP | 2005005685 A | 1/2005 |
| JP | 2010118916 A | 5/2010 |
| KR | 10-2009-0076840 A | 7/2009 |
| TW | 200701264 A | 1/2007 |
| TW | 200828363 A | 7/2008 |
| TW | 201106389 A | 2/2011 |

OTHER PUBLICATIONS

Long, John R. "Monolithic Transformers for Silicon RF IC Design", IEEE Journal of Solid-State Circuits, vol. 35, No. 9, Sep. 2000, pp. 1368-1382.
Office action received for German Patent Application No. 10 2013 101 7681, dated Oct. 15, 2013, 8 pages of office action and 4 pages of English Translation.
Office Action received from KR application 20140019378, dated Jan. 20, 2015, 8 pages with 4 pages Englisch translation thereof (for reference purpose only).
Taiwanese Office Action based on Application No. 103104594 (6 Pages of OA and 6 pages of English translation) dated Sep. 7, 2015 (Reference Purpose Only).
Notice of Allowance received for KR application 20140019378, dated May 22, 2015, 2 pages with 1 page of English translation.
Office Action received for TW application No. 103104594, dated May 22, 2015, 7 pages with 9 pages of English translation.
U.S. Office Action based on U.S. Appl. No. 15/019,980 (9 Pages) dated Jul. 20, 2017 (Reference Purpose Only).
Office Action received for CN Patent Application No. 201410059122.8 dated Nov. 4, 2015, 6 pages of Office Action and 11 pages of English Translation.
Office Action received for the corresponding Taiwanese Patent Application Serial No. 10520017560, dated Jan. 8, 2016, 8 pages including 3 pages of English translation.

* cited by examiner

TRANSFORMER AND ELECTRICAL CIRCUIT

CROSS-REFERENCE TO RELATED APPLICATION

This application claims priority to German Patent Application Serial No. 10 2013 101 768.1, which was filed Feb. 22, 2013, and is incorporated herein by reference in its entirety.

TECHNICAL FIELD

This disclosure generally relates to transformers and electrical circuits.

BACKGROUND

For fully integrating a mobile radio transceiver including a power amplifier with transformer output matching network on a chip, it is desirable for the transformer output matching network of the power amplifier to be highly balanced, for example in order that common-mode signals are suppressed well. Moreover, it is desirable for further components, possibly arranged on the chip or in the same chip package, to be influenced as little as possible.

SUMMARY

A transformer is provided. The transformer includes at least one first primary turn; at least one second primary turn; and a first secondary turn and a second secondary turn. The first secondary turn and the second secondary turn are arranged laterally between the at least one first primary turn and the at least one second primary turn. The first secondary turn and the second secondary turn are arranged one above the other.

Furthermore, an electrical circuit is provided. The electrical circuit may include a first differential branch having a first end, which is coupled to a supply node supplied with a first supply potential, and a second end; a second differential branch having a first end, which is coupled to the supply node, and a second end; a primary turn of a transformer. The primary turn is connected between the second end of the first differential branch and the second end of the second differential branch. The primary turn has a center connection supplied with a second supply potential; and a feedback path, which couples the center connection to the supply node by means of a capacitance and which runs at least partly in the interior of the primary turn.

BRIEF DESCRIPTION OF THE DRAWINGS

The figures do not reproduce the actual size relationships, but rather are intended to serve to illustrate the principles of the various exemplary embodiments. Various examples are described below with reference to the following figures.

DESCRIPTION

The following detailed description refers to the accompanying figures showing details and various implementations. These implementations are described in sufficient detail to enable a person skilled in the art to implement the invention. Other implementations are also possible and the implementations can be modified from a structural, logical and electrical standpoint, without departing from the subject matter of the implementations. The various implementations are not necessarily mutually exclusive, rather different implementations can be combined with one another, thereby giving rise to new implementations.

For fully integrating a mobile radio transceiver including the power amplifier (PA) in a system-on-chip solution (SoC), it is typically necessary to implement high-quality matching networks. The output matching network of the power amplifier, in particular, is of particularly great importance here since very low values for the insertion loss have to be achieved in order to achieve a high power amplifier efficiency and thus to minimize the current consumption. In addition, the differential signal of the power amplifier output stage is typically intended to be converted into an unbalanced RF (radiofrequency) output signal relative to ground. Capacitively tuned transformers are typically used for this purpose, wherein the primary turn is simultaneously used for feeding the supply voltage. This is illustrated in FIG. 1.

Figure 1:
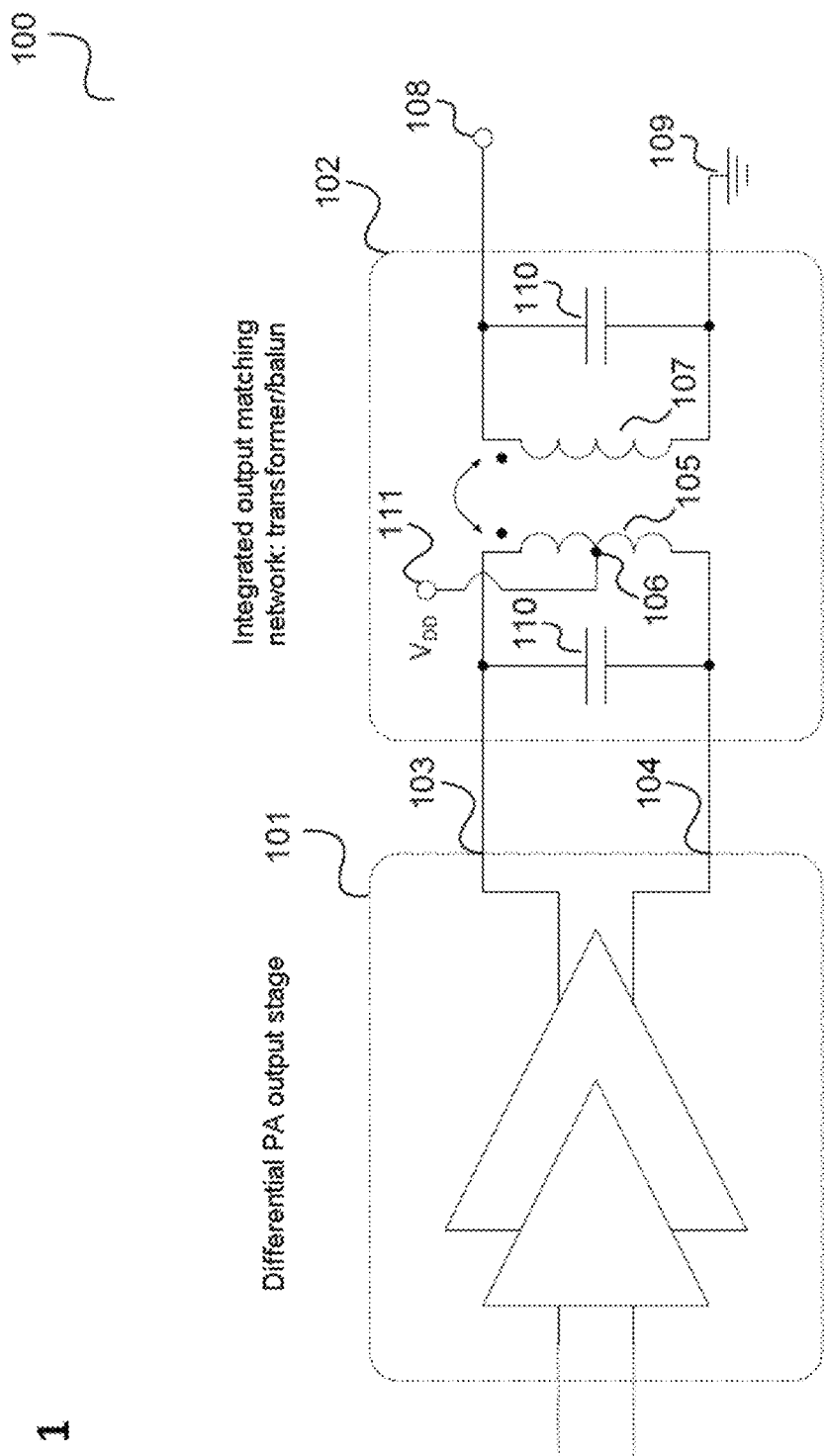
FIG. 1 shows an (integrated) power amplifier circuit.

FIG. 1 shows an (integrated) power amplifier circuit 100.

The (integrated) power amplifier circuit 100 includes a differential power amplifier 101 and an output matching network/balun 102.

The differential outputs 103, 104 of the power amplifier 101 are coupled to the primary winding 105 of a transformer of the output matching network/balun 102. The supply voltage VDD is fed in from a supply voltage node 111 via a center tap 106 of the primary winding 105 (i.e. of the primary side of the transformer). One connection of the secondary winding 107 forms the output 108 of the output matching network/balun 102. The other connection of the secondary winding 107 is connected to a ground connection 109. Capacitances 110 are additionally connected in parallel with the primary winding and with the secondary winding.

Besides the lowest possible losses, a high balancing is required in order firstly to obtain very good suppression of common-mode signals (typically even-numbered harmonics) and secondly to offer the same load impedance to both parts of the differential output stage 101. This last is particularly important in order to ensure actually differential/balanced operation of the output stage 101 in the first place and thus to suppress common-mode signals as much as possible, to operate the power amplifier 101 with maximum efficiency and to load the partial stages of the power amplifier uniformly in terms of current and voltage, in order to achieve a high reliability. Moreover, very high balancing ensures that the impedance at the supply voltage node 111 has only very little influence on the performance of the power amplifier 101.

Besides high balancing, it is desirable for the interference that affects other components as a result of the feeding of the supply voltage and the associated ground network (e.g. in an integrated circuit which implements the power amplifier 101 and/or the output matching network/balun 102, in the chip package and the circuit board in and respectively on which the transceiver circuit 100 is integrated) to be low. Typically, the center tap of the transformer is connected to the corresponding pad structures for the supply voltage VDD with the lowest possible resistance and inductance. The same applies to the ground link of the power amplifier 101.

However, the power amplifier typically has a common ground impedance in a chip package or on a circuit board with other, sensitive circuit parts. This is illustrated in FIG. 2.

Figure 2:
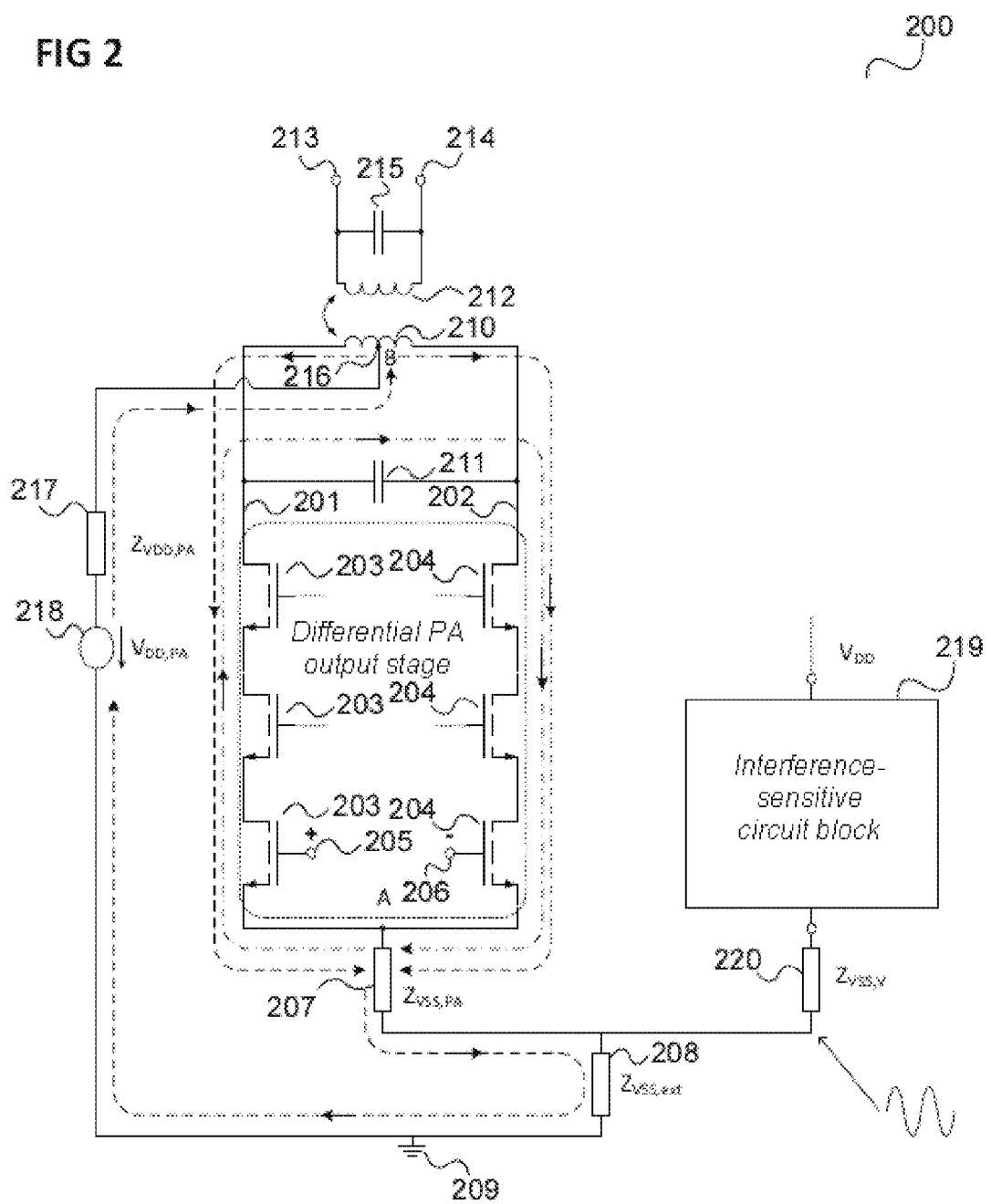
FIG. 2 shows an amplifier circuit.

FIG. 2 shows an amplifier circuit 200.

The amplifier circuit 200 includes a first differential branch 201 having one or a plurality of first field effect transistors 203 and a second differential branch 202 having one or a plurality of field effect transistors 204. The first differential branch 201 has a first connection 205, which forms the positive input of the amplifier 200, and the second differential branch 202 has a second connection 206, which forms the negative input of the amplifier 202.

The differential branches 201, 202 are coupled to one another at one end at a node A, which is coupled to a ground connection 209 via a first resistor 207 and via a second resistor 208. A primary winding 210 of a transformer is coupled between the other ends of the differential branches 201, 202, which can be regarded as outputs of the amplifier formed by the differential branches 201, 202, analogously to the outputs 103, 104 of the power amplifier 101. A first capacitance 211 is arranged in parallel with the primary winding 210. The connections of the secondary winding 212 form, for example, the outputs 213, 214 of the amplifier circuit, wherein one of the outputs 213, 214 is connected to ground analogously to FIG. 1, for example. A second capacitance 215 is connected between the outputs 213, 214.

The primary winding 210 has a center connection 216, designated as node B, by means of which the supply voltage VDD is fed from a voltage source 218 via a third resistor 217. The voltage source 218, for its part, is coupled to the ground connection 209.

In this example, a further circuit block 219 is likewise coupled to the ground connection 209 via a fourth resistor 220 and the second resistor 208. The resistors 207, 208, 217, 220 can generally be impedances (for example having a certain inductance). The circuit block 219 is, for example, part of the same chip package as the amplifier or is arranged on the same circuit board.

On account of the common ground connection, common-mode components (illustrated by dashed lines in FIG. 2) of the RF current can undergo crosstalk to the circuit block 219 through the amplifier.

The flow of the differential-mode components is illustrated by dash-dotted lines for clarification in FIG. 2.

As described below, by way of example, a low-loss, highly balanced transformer with direct feedback of the common-mode currents in the RF core of the power amplifier is provided, whereby crosstalk can be significantly reduced.

Figure 3:
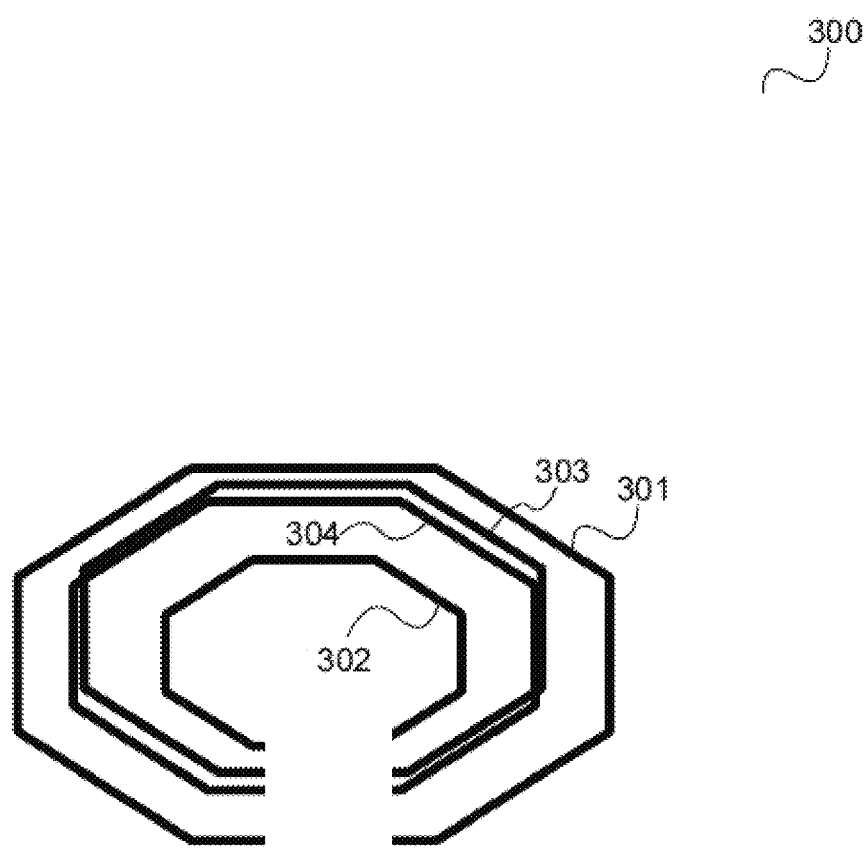
FIG. 3 shows a transformer.

FIG. 3 shows a transformer 300.

The transformer includes at least one first primary turn 301 and at least one second primary turn 302.

The transformer furthermore includes a first secondary turn 303 and a second secondary turn 304. The first secondary turn 303 and the second secondary turn 304 are arranged laterally between the at least one first primary turn 301 and the at least one second primary turn 302, and the first secondary turn 303 and the second secondary turn 304 are arranged one above the other.

In other words, in a transformer, turns of the primary side and of the secondary side are arranged in such a way that turns belonging to different sides couple laterally and turns belonging to the same side couple vertically. This has the result of minimizing for example coupling capacitances between the primary and secondary sides as a result of lateral coupling, as a result of which the balancing is increased. Positioning the secondary side between two parallel-connected parts of the primary winding increases the lateral coupling between the primary and secondary sides with only little influence on the balancing. In order to increase the efficiency, the N individual turns of the secondary winding (possibly also in the case of the primary winding in the case of primary sides where N>1) are embodied with vertical coupling. This has the result of increasing the coupling between the individual turn parts, as a result of which the quality factor is in turn increased.

The first secondary turn and the second secondary turn are connected in series, for example.

The transformer comprises, for example, at least one further secondary turn which is arranged laterally between the first primary turn and the at least one second primary turn.

By way of example, the further secondary turn is arranged at least partly above at least one part of the first primary turn or at least one part of the second primary turn.

The further secondary turn, the first secondary turn and the second secondary turn are connected in series, for example.

For example, the first secondary turn is arranged in a first plane, and the second secondary turn and the further secondary turn are arranged in a second plane above the first plane.

The first secondary turn and the second secondary turn may have a different width.

The first secondary turn and the second secondary turn may be arranged in different metallization planes.

By way of example, the first secondary turn and the second secondary turn are formed by the different metallization planes.

The first primary turn and the second primary turn are connected in parallel, for example.

The at least one first primary turn is, for example, a plurality of first primary turns.

The primary turns of the plurality of first primary turns are connected in parallel, for example.

The at least one second primary turn is, for example, a plurality of second primary turns.

The primary turns of the plurality of second primary turns are connected in parallel, for example.

The at least one first primary turn has for example a first part at the level of the first secondary turn and a second part at the level of the second secondary turn.

The at least one second primary turn has for example a first part at the level of the first secondary turn and a second part at the level of the second secondary turn.

The primary turns and the secondary turns are arranged on a die or chip, for example.

For example, the primary turns and the secondary turns are formed by striplines.

Figure 4:
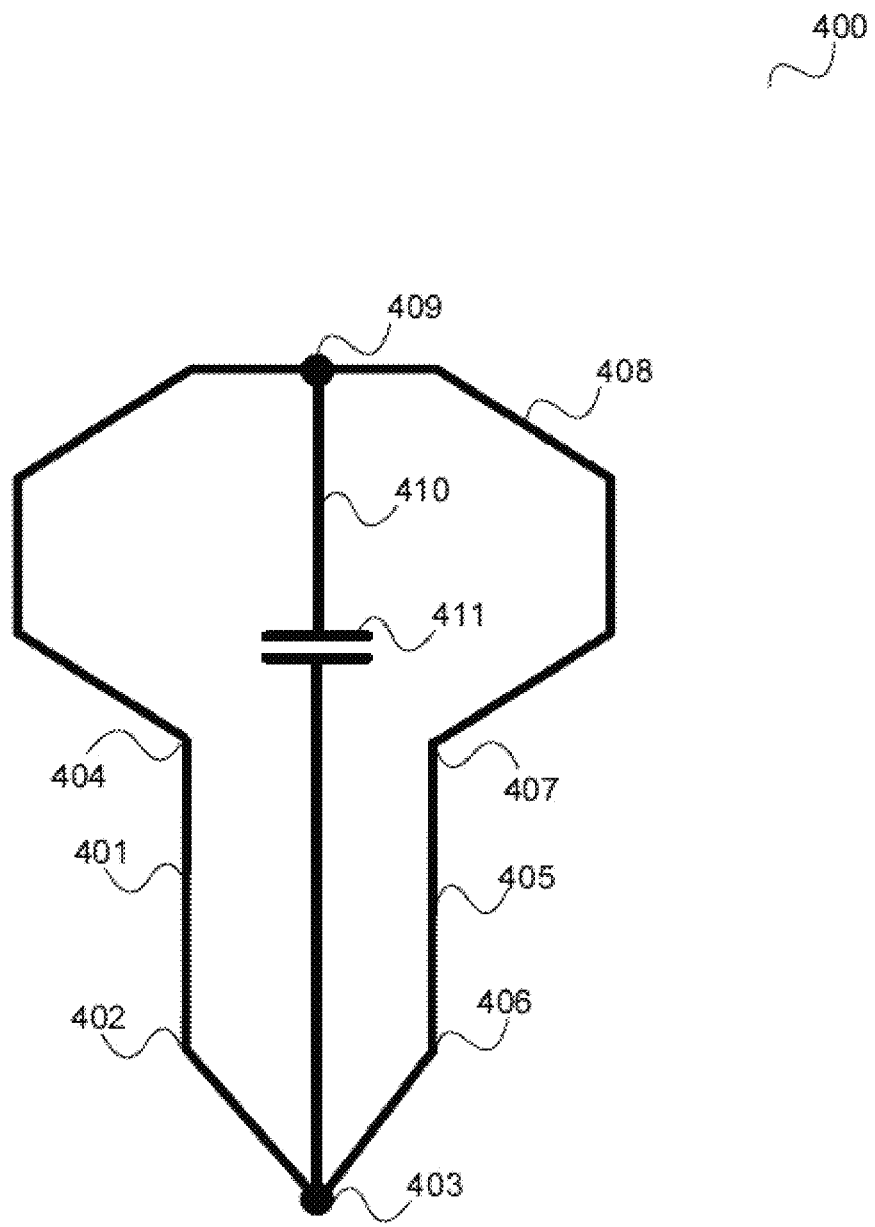
FIG. 4 shows an electrical circuit.

FIG. 4 shows an electrical circuit 400.

The electrical circuit 400 includes a first differential branch 401 having a first end 402, which is coupled to a supply node 403 supplied with a first supply potential, and a second end 404.

Moreover, the electrical circuit 400 comprises a second differential branch 405 having a first end 406, which is coupled to the supply node 403, and a second end 407.

The electrical circuit 400 furthermore includes a primary turn 408 of a transformer. The primary turn is connected between the second end 404 of the first differential branch 401 and the second end 407 of the second differential branch 405, wherein the primary turn 408 has a center connection 409 supplied with a second supply potential.

The electrical circuit 400 furthermore includes a feedback path 410, which (capacitively) couples the center connection 409 to the supply node 403 by means of a capacitance 409 and which runs at least partly in the interior of the primary turn 408.

In other words, a feedback (or return coupling) to a supply potential (e.g. to ground) from the supply connection of one or a plurality of primary turns is arranged in the interior of the primary turns (and thus typically on the shortest path). The interior of the primary turns is, for example, the region enclosed by the primary turns.

Coupling can be understood (depending on the context) as capacitively or inductively coupled or as electrically conductively connected (e.g. galvanically connected).

By way of example, one or a plurality of blocking capacitances and the common-mode signal feedback are integrated into the transformer (in the interior of the primary winding). Illustratively, RF common-mode currents can thus be locally short-circuited.

The differential branches are amplifier branches, for example.

Each of the differential branches has for example in each case at least one transistor.

For example, the (respective) transistor has a control input, which forms the input of the differential branch.

The inputs of the differential branches are differential amplifier inputs, for example.

For example, the primary turn is arranged in a metallization plane and the feedback path is arranged at least partly in the metallization plane.

The primary turn can have a first connection, which is coupled to the second end of the first differential branch, and may have a second connection, which is coupled to the second end of the first differential branch, wherein the feedback path leads out of the interior of the primary turn for example between the first connection and the second connection.

The electrical circuit includes for example a primary winding having a plurality of primary turns of the transformer, said primary winding being connected between the second end of the first differential branch and the second end of the second differential branch, wherein the feedback path runs for example at least partly in the interior of the primary winding.

The feedback path runs for example between two symmetrical branches of the primary turn.

For example, the feedback path runs along an axis of symmetry of the primary turn which runs through the center connection.

The feedback path may run at least partly between the differential branches.

The first supply potential is for example a low supply potential (e.g. VSS) and the second supply potential is for example a high supply potential (e.g. VDD).

The capacitance is arranged for example in the interior of the primary turn.

The capacitance may also be arranged outside the primary turn.

It should be taken into consideration that the transformer 300 may be used for the electrical circuit 400, that is to say that the primary turn of the circuit 400 is a primary turn of the transformer 300. Accordingly, examples and features which are described in connection with the transformer 300 are analogously valid for the electrical circuit 400.

Examples of the transformer 300 and the electrical circuit 400 are described in greater detail below.

Transformers for use in integrated circuits can comprise two vertically coupled inductances ("stacked transformer") or two laterally coupled inductances ("interdigitated winding transformer").

Figure 5:
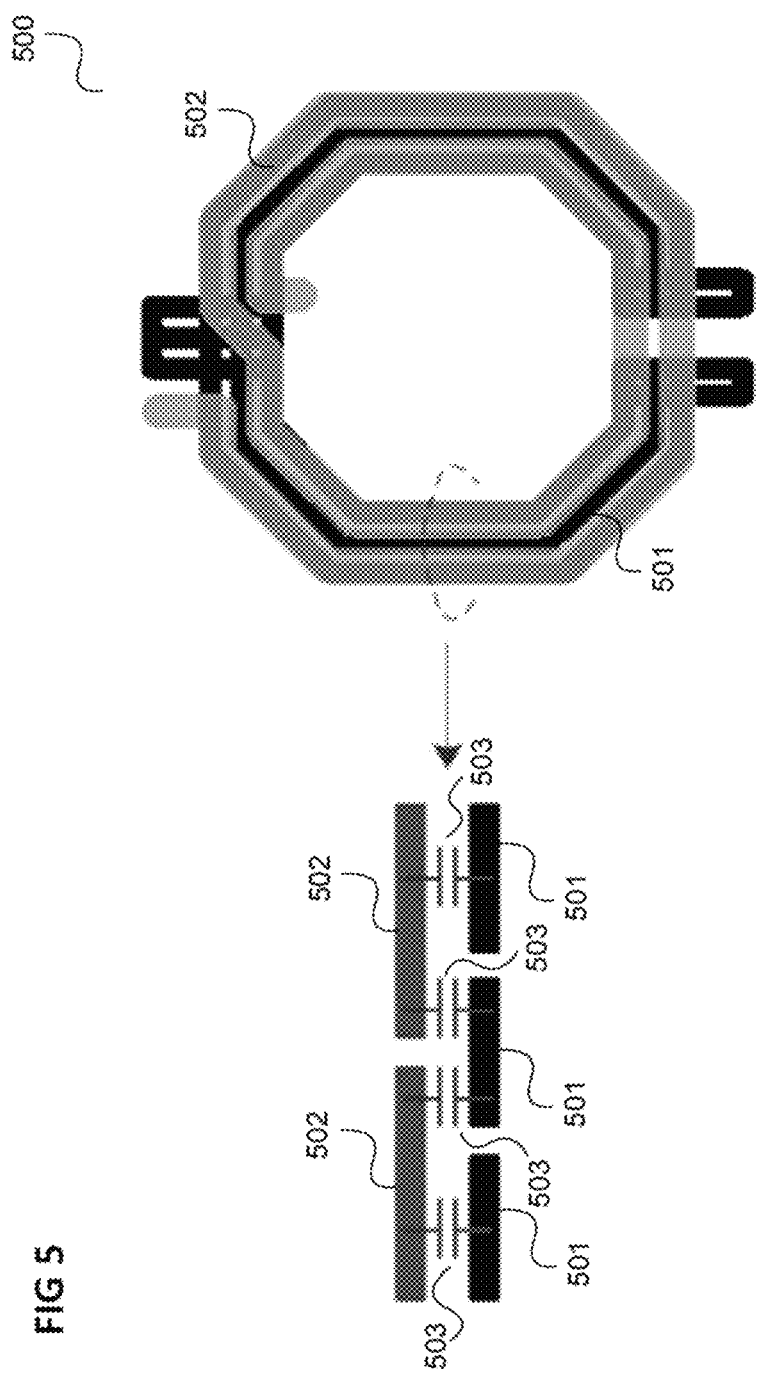
FIG. 5 shows a transformer having vertical coupling between the primary winding and the secondary winding.

FIG. 5 shows a transformer 500 with vertical coupling between the primary winding and the secondary winding.

The transformer includes a primary winding 501 having three parallel-connected primary turns and a secondary winding 502 having two series-connected secondary turns.

The two windings 501, 502 of the transformer are arranged one directly above the other in two different metal layers. In this way, it is possible to achieve very high coupling factors, and thus a high efficiency or a low insertion loss. In order to minimize the series resistance, however, the turns must have a certain conductor width. That automatically leads to high coupling capacitances 503 between the primary side 501 and the secondary side 502 and thus to an unbalanced behavior if the secondary side 502 is grounded at one end, as is the case for a balun.

Figure 6:
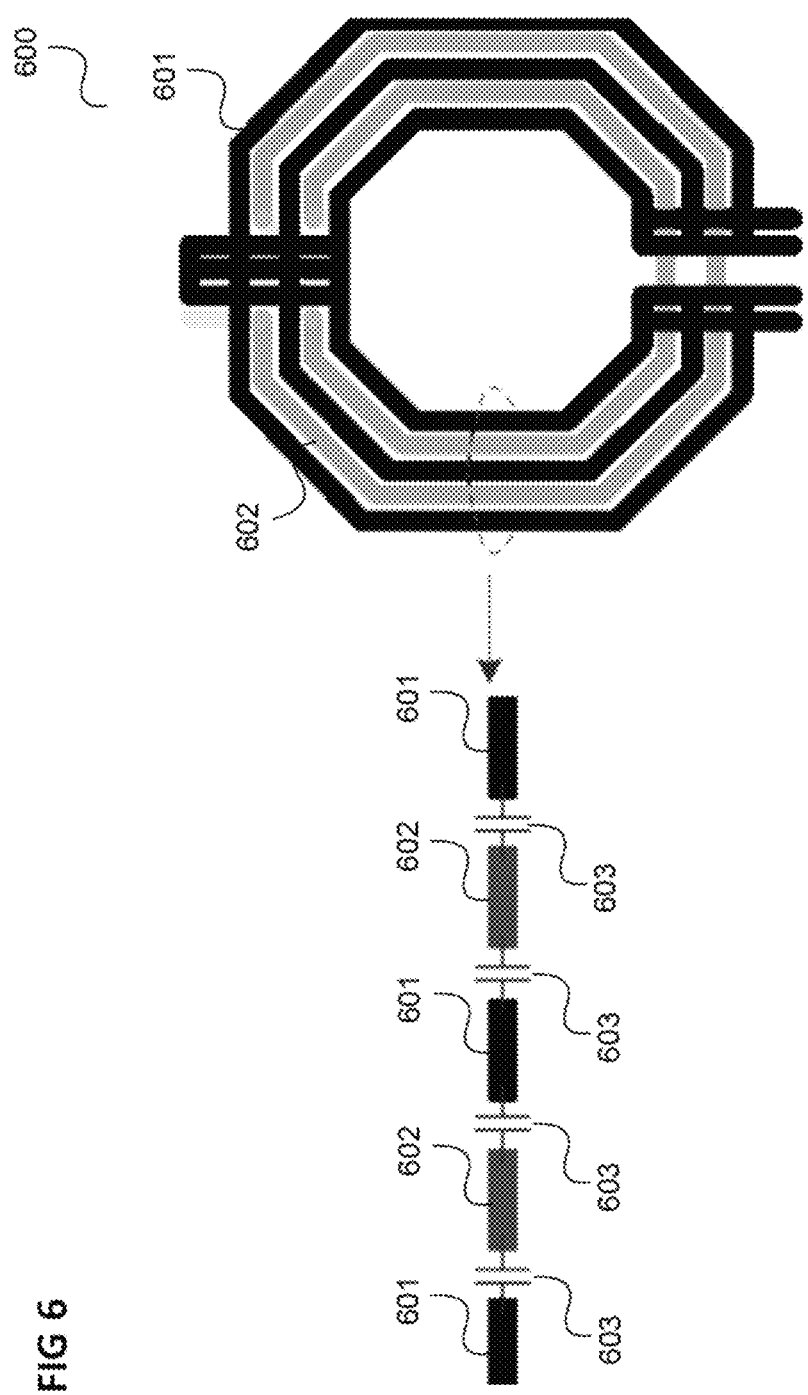
FIG. 6 shows a transformer having lateral coupling between the primary winding and the secondary winding, which are arranged in an interdigitated manner.

FIG. 6 shows a transformer 600 with vertical coupling between the primary winding and the secondary winding.

The transformer includes a primary winding 601 having three parallel-connected primary turns and a secondary winding 602 having two series-connected secondary turns.

In this example, the two windings 601, 602 of the transformer 600 are arranged in the same metal layer (or the same metal layers) in one plane. The coupling capacitances 603 are significantly reduced compared with the transformer 500 since the height of the metallization is typically significantly smaller than the conductor width of the turns. However, the inductive coupling between the primary side 601 and the secondary side 602 is relatively low in the case of such an arrangement.

As a result of interdigitization of the primary winding 601 and the secondary turn 602 (as shown in FIG. 6), this disadvantage may partly be compensated for again, but at the expensive of an increased series resistance as a result of the additional required crossovers between primary turns and secondary turns.

Figure 7:
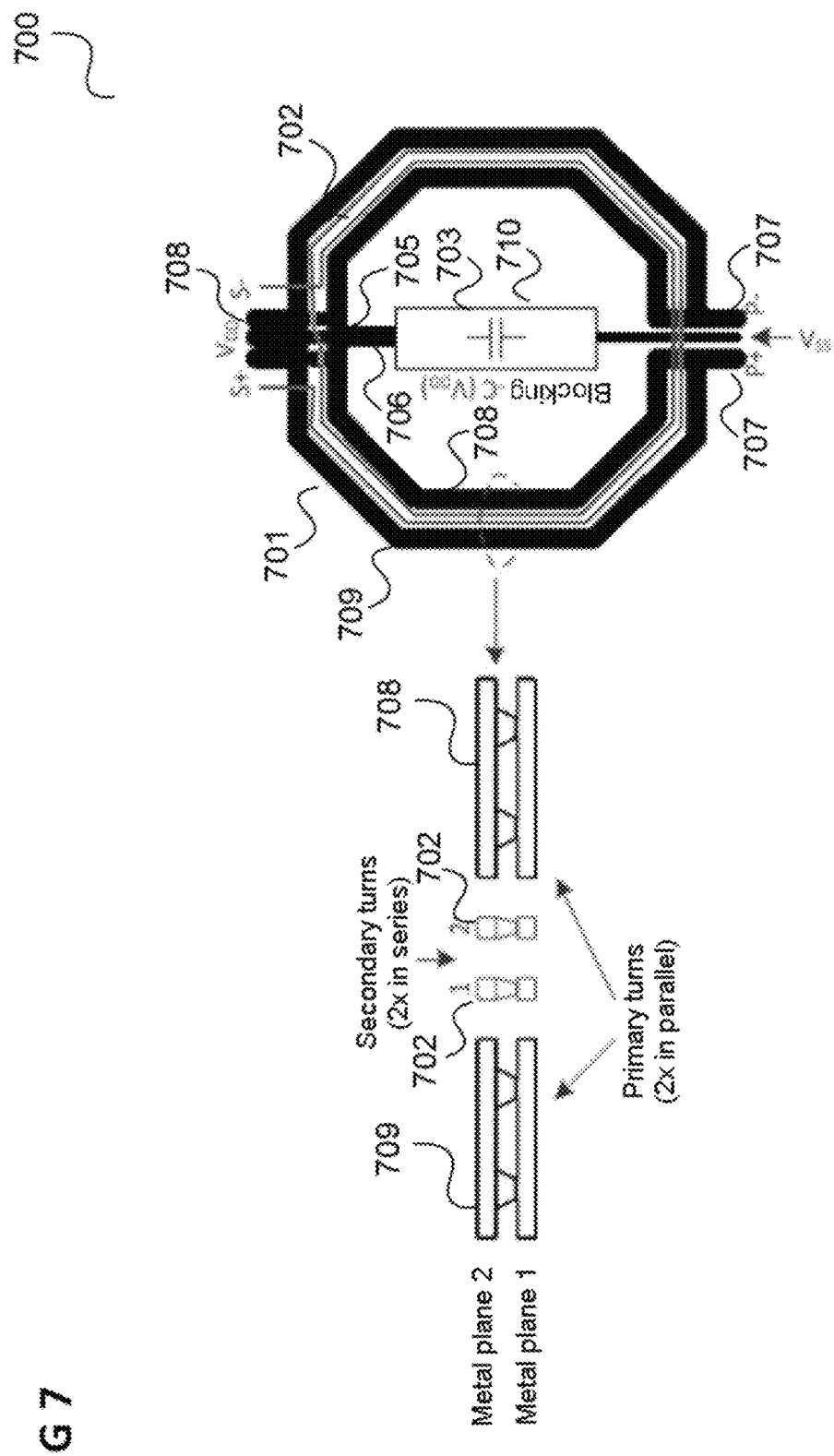
FIG. 7 shows a transformer having lateral coupling between the primary winding and the secondary winding and lateral coupling between the secondary turns.

FIG. 7 shows a transformer 700 with lateral coupling between the primary winding and the secondary winding and lateral coupling between the secondary turns.

The transformer 700 includes a primary winding 701 having two parallel-connected primary turns 708, 709 and a secondary winding 702 having two series-connected secondary turns.

The primary side 701 and the secondary side 702 couple laterally, wherein the two turns of the secondary side 702 also lie in one plane and therefore couple laterally. In contrast to the transformer 600, here both secondary turns are arranged between the primary turns, which further reduces the capacitive coupling compared with the transformer 600.

In the case of the transformer 700, a capacitance 703 is furthermore arranged within the primary turn 701, for example for the supply voltage of an amplifier for which the transformer is used. The inner primary turn 704 of the primary winding 701 has for this purpose a center connection 705, to which the capacitance 703 is coupled. The capacitance 703 and also the connection 706 coupling the capacitance 703 to the center connection 705 are part of a feedback path 710, which leads out of the interior of the primary turn 701 between the connections 707 of the primary turn 701 and is coupled to a ground connection node, for example. By way of example, the center connection 705 corresponds to the node B of the amplifier circuit 200 and the ground connection node corresponds to the node A of the amplifier circuit 200. The connections 707 of the primary winding correspond for example to the connections of the differential branches 201, 202 to the primary winding 210. In this example, the supply voltage is fed to the primary winding 701 at a VDD connection 708, which is arranged on the outer primary turn 709.

The feedback path 710 enables the feedback of the common-mode current. Besides the saving of chip area, such a feedback of the common-mode current on a short (or even shortest) path (through the interior of the primary turn 701) enables a reduction of the crosstalk via common ground impedances, as explained in connection with FIG. 2. Furthermore, the inductive coupling path for the common-mode interference can be greatly suppressed by the minimization of the corresponding conductor loop.

The feedback path 710 can be regarded as an example of the feedback path of the electrical circuit 400.

Figure 8:
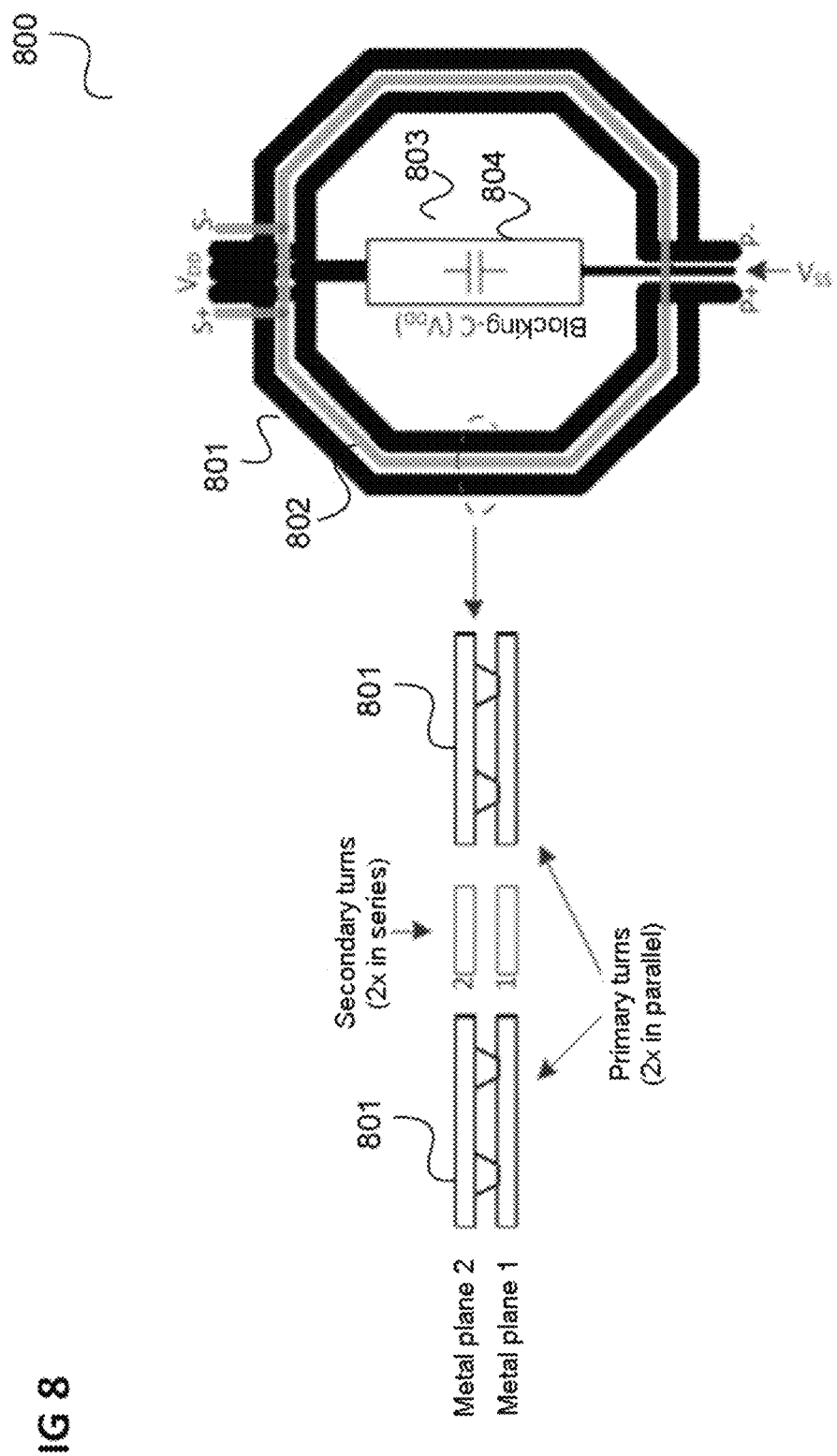
FIG. 8 shows a transformer having lateral coupling between the primary winding and the secondary winding and vertical coupling between the secondary turns.

FIG. 8 shows a transformer 800 with lateral coupling between the primary winding and the secondary winding and vertical coupling between the secondary turns.

The transformer 800 includes a primary winding 801 having two parallel-connected primary turns and a secondary winding 702 having two series-connected secondary turns.

In this example, the individual turns of the secondary inductance 702 are designed such that the coupling factor between them becomes as high as possible. In the example shown, the secondary side 702 has two turns arranged one above the other in two metal layers in a vertically coupling fashion. The compact cross section of this structure leads to high coupling factors and thus a low insertion loss. The higher capacitance between the two secondary turns can typically be accepted since these have no influence on the balancing of the circuit.

The transformer 800 can be regarded as an example of the transformer 300.

The transformer 800 furthermore includes a feedback path 803 and an integrated (blocking) capacitance 804 analogously to the transformer 700.

The table below shows a comparison of the performance data of optimized PA output transformers corresponding to the examples in FIG. 5, FIG. 6 and FIG. 8 on the basis of simulation results. With minimal losses with regard to damping, the high balancing of laterally coupled transformers can be achieved with the structure in accordance with FIG. 8.

| | Transformer coupling | | |
|---|---|---|---|
| | Transformer in accordance with FIG. 5 | Transformer in accordance with FIG. 6 | Transformer in accordance with FIG. 8 |
| Insertion loss (dB) | 0.62 | 0.9 | 0.68 |
| Amplitude error (dB) | 1.4 | 0.44 dB | 0.4 dB |
| Phase error (°) | 10 | 2 | 2.3 |

The transformer structures shown can also be realized with non-integral numbers of turns.

Figure 9:
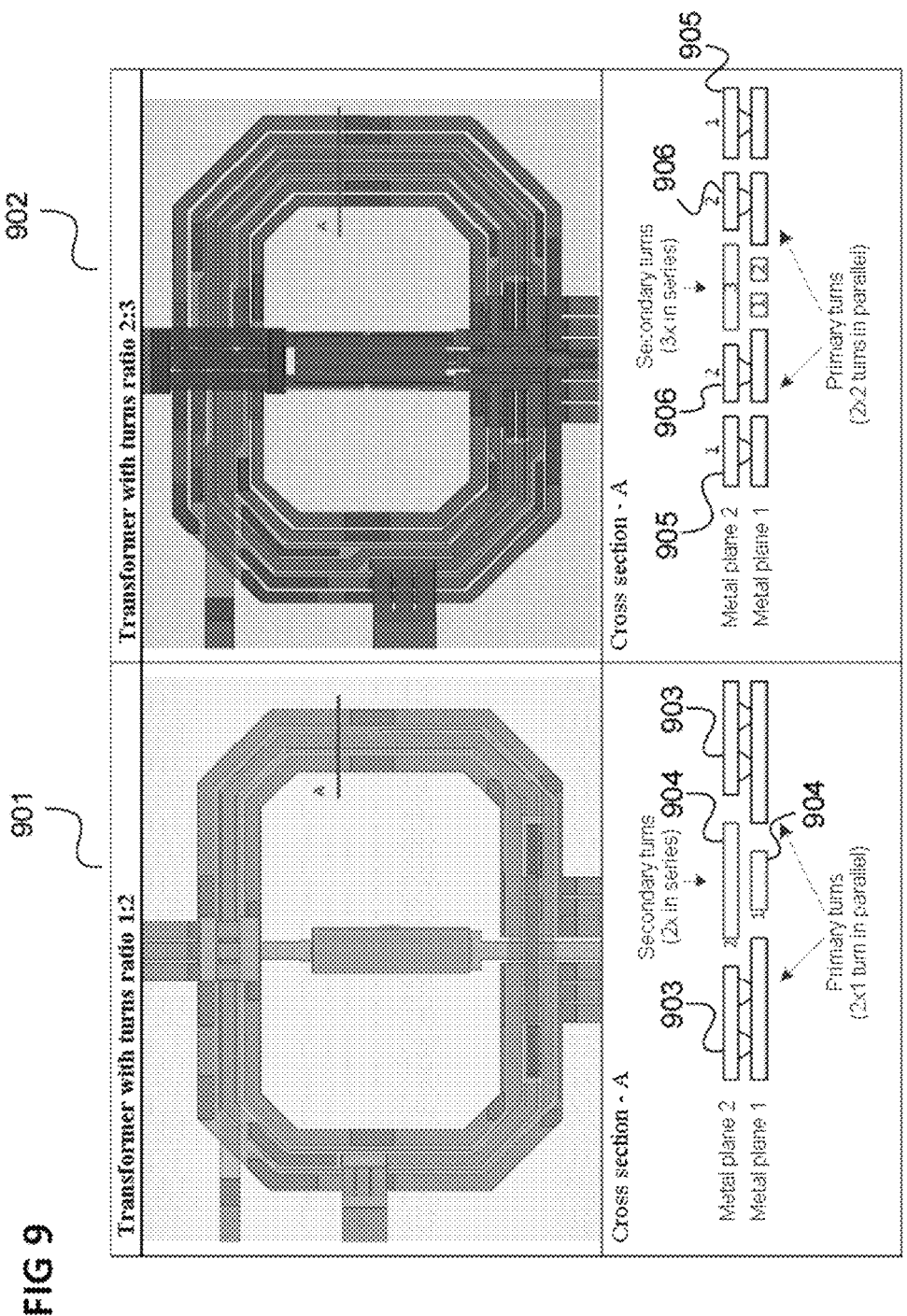
FIG. 9 shows transformers.

Further examples of implementations of a highly balanced transformer having an integrated feedback path are illustrated in FIG. 9.

FIG. 9 shows transformers 901, 902.

The first transformer 901 includes a primary winding 903 having two parallel-connected primary turns and a secondary winding 904 having two series-connected secondary turns.

The second transformer 902 includes a primary winding having a first pair 905 of parallel-connected primary turns and a second pair 906 of parallel-connected primary turns, wherein the pairs 905, 906 are connected in series, and a secondary winding 907 having three series-connected secondary turns.

In both examples, the secondary-side output was positioned in a manner rotated by 90°; the orientation of the coils with respect to one another is unimportant, however. Moreover, a blocking capacitance 908, as described above, is in each case arranged within the transformer 901, 902. A further possibility is to lead only the lines for supply (VDD) and ground (VSS) within the transformer and to arrange the blocking capacitance itself outside the transformer.

Hybrid arrangements are also possible for the arrangement of the primary/secondary turns, that is to say that partial turns of the secondary side couple vertically to the primary side. One example of this is illustrated in FIG. 10.

Figure 10:
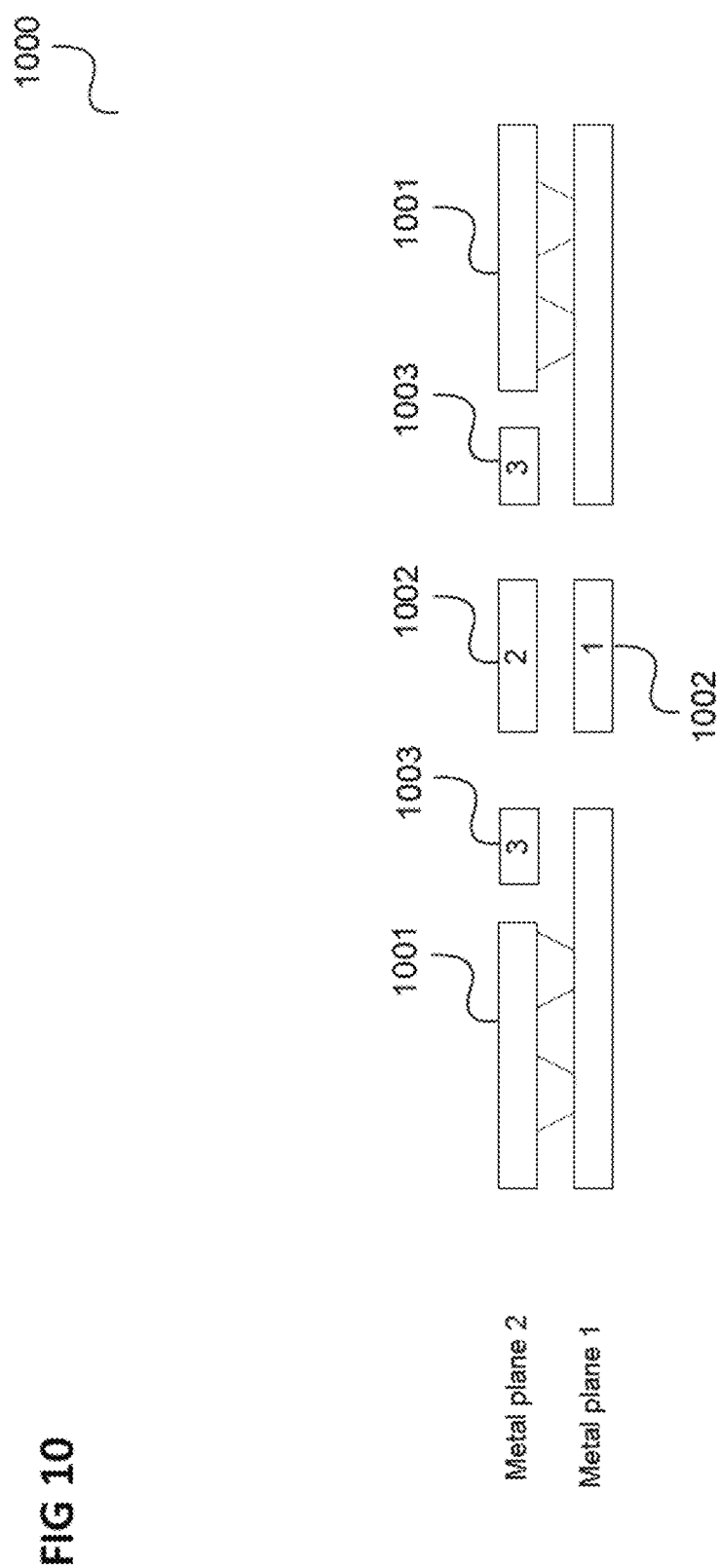
FIG. 10 shows an arrangement of turns of a transformer.

FIG. 10 shows an arrangement of turns of a transformer.

The transformer includes a primary winding 1001 having two parallel-connected primary turns and a secondary winding 904 having three series-connected secondary turns 1002, 1003, wherein one of the secondary turns 1003 consists of two parallel-connected secondary turns.

In this example, the two parallel-connected secondary turns 1003 couple vertically to the primary side 1001.

For reasons of balancing, for example, the secondary turn 1003 which consists of two parallel-connected secondary turns is grounded, for example in order to implement a balun.

Although the invention has been shown and described primarily with reference to specific embodiments, it should be understood by those familiar with the technical field that numerous modifications can be made thereto with regard to configuration and details, without departing from the essence and scope of the invention as defined by the claims hereinafter. The scope of the invention is therefore determined by the appended claims, and the intention is for all modifications which come under the literal meaning or the range of equivalence of the claims to be encompassed.

The invention claimed is:

1. A transformer, comprising:
at least one first primary turn; wherein the at least one first primary turn comprises a further first primary turn, wherein the first primary turns are arranged in different metallization planes which are parallel with each other;
at least one second primary turn; and
a first secondary turn and a second secondary turn;
wherein the first secondary turn is arranged laterally between the at least one first primary turn and the at least one second primary turn; and
wherein the first secondary turn and the second secondary turn are arranged in different metallization planes, which are parallel with each other.

2. The transformer of claim 1,
wherein the first secondary turn and the second secondary turn are arranged laterally between the at least one first primary turn and the at least one second primary turn.

3. The transformer of claim 1, further comprising:
wherein the at least one second primary turn comprises a further second primary turn, wherein the second primary turns are arranged in different metallization planes which are parallel with each other.

4. The transformer of claim 1,
wherein the primary turns and the secondary turns are arranged on a die or a chip.

5. An electronic circuit, comprising:
a power amplifier; and
a transformer coupled to the amplifier circuit and comprising:
    at least one first primary turn;
    at least one second primary turn; and
    a first secondary turn and a second secondary turn;
    wherein the first secondary turn is arranged laterally between the at least one first primary turn and the at least one second primary turn; and
    wherein the first secondary turn and the second secondary turn are arranged in different metallization planes, which are parallel with each other.

6. The electronic circuit of claim 5,
wherein the power amplifier is a differential power amplifier.

7. The electronic circuit of claim 5, further comprising:
an output matching network, wherein the output matching network comprises the transformer.

8. A transformer, comprising:
at least one first primary turn;
at least one second primary turn; and
a first secondary turn and a second secondary turn;
wherein the first secondary turn is arranged laterally between the at least one first primary turn and the at least one second primary turn; and
wherein the first secondary turn and the second secondary turn are arranged in different planes which are parallel with each other;
wherein the at least one first primary turn comprises a further first primary turn, wherein the first primary turns are arranged in different planes which are parallel with each other; and
wherein the at least one second primary turn comprises a further second primary turn, wherein the second primary turns are arranged in different planes which are parallel with each other.

9. The transformer of claim 8,
wherein the first secondary turn and the second secondary turn are arranged laterally between the at least one first primary turn and the at least one second primary turn.

10. The transformer of claim 8,
wherein the primary turns and the secondary turns are arranged on a die or a chip.

11. The transformer of claim 8,
wherein the first secondary turn and the second secondary turn are arranged in different metallization planes.

12. An electronic circuit, comprising:
an amplifier; and
a transformer coupled to the amplifier circuit and comprising:
    at least one first primary turn;
    at least one second primary turn; and
    a first secondary turn and a second secondary turn;
    wherein the first secondary turn is arranged laterally between the at least one first primary turn and the at least one second primary turn; and
    wherein the first secondary turn and the second secondary turn are arranged in different planes which are parallel with each other;
    wherein the at least one first primary turn comprises a further first primary turn, wherein the first primary turns are arranged in different planes which are parallel with each other; and
    wherein the at least one second primary turn comprises a further second primary turn, wherein the second primary turns are arranged in different planes which are parallel with each other.

13. The electronic circuit of claim 12,
wherein the amplifier is a power amplifier.

14. The electronic circuit of claim 13,
wherein the power amplifier is a differential power amplifier.

15. The electronic circuit of claim 12, further comprising:
an output matching network, wherein the output matching network comprises the transformer.

* * * * *